United States Patent [19]

Venaas et al.

[11] 4,386,313
[45] May 31, 1983

[54] ELECTRICITY THEFT PREVENTING METER

[75] Inventors: Norman B. Venaas; Dale F. Becker, both of Seneca, S.C.

[73] Assignee: Sangamo Weston, Inc., Norcross, Ga.

[21] Appl. No.: 208,729

[22] Filed: Nov. 20, 1980

[51] Int. Cl.³ .............................................. G01R 11/24
[52] U.S. Cl. ..................................... 324/110; 339/37; 339/198 M; 361/372
[58] Field of Search .................... 324/110; 339/36, 37, 339/40, 198 M; 361/364, 369, 370, 371, 372, 373

[56] References Cited

U.S. PATENT DOCUMENTS 4,175,813 11/1979 Mentesana ........................... 324/110

Primary Examiner—Ernest F. Karlsen
Attorney, Agent, or Firm—Dale Gaudier

[57] ABSTRACT

An electricity meter has one of its bayonets slidably carried by the meter base. When the meter is inserted in a meter socket, the bayonet in its normally retracted position conducts electrical power to the full potential coil. When the meter is removed, the socket functionally holds the bayonet until it slides to a detented extended position where the bayonet is locked into position and is connected so as to bypass a portion of the potential coil. When the meter is reinserted, the meter runs fast.

6 Claims, 4 Drawing Figures

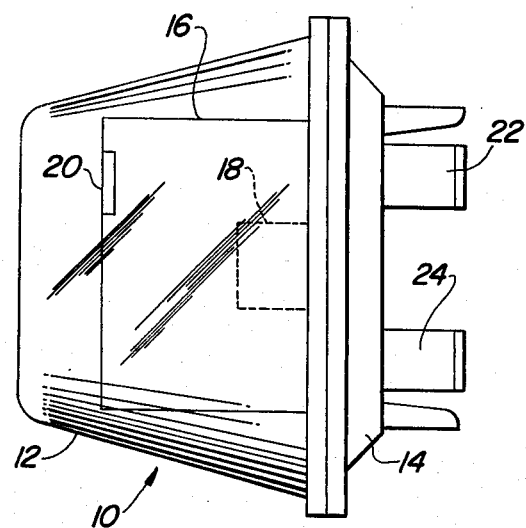
FIG. 1
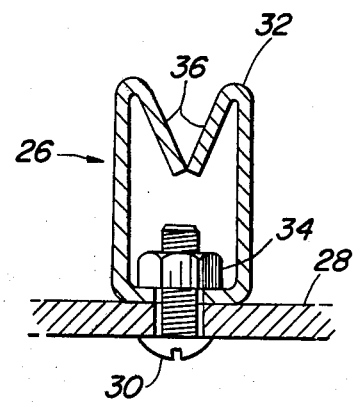
FIG. 2
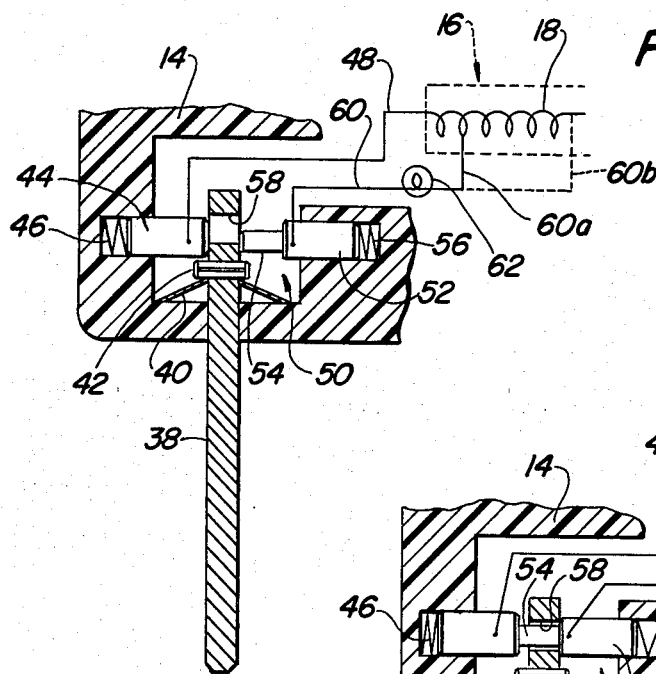
FIG. 3
FIG. 4

ELECTRICITY THEFT PREVENTING METER

BACKGROUND OF THE INVENTION

The present invention relates generally to electricity theft combating meters and more particularly to meters of the type disclosed in copending application Ser. No. 208,730, filed Nov. 20, 1980, assigned to the same assignee as the present application, which merely light an indicator light or stop the meter indicator or read fast if removed from and reinstalled in their sockets.

In recent years, with the increase in the cost of electricity there has been a corresponding increase in the tampering with electricity meters to steal electricity. Types of tampering include removing and inverting a meter so it will run backwards, taking out a meter and replacing it with jumpers, and putting resistors in series with the meter disconnect switches.

The problem of inversion and running the meter backward can be coped with by using so called unidirectional registers. The possibility of adding resistors can be eliminated by eliminating the disconnect switches. However, neither of these solutions prevent tampering such as removal of the meter and replacement with jumpers.

Various proposals have been made to secure the meter to the socket in different ways so it cannot be removed. These proposals have all been rejected because it is sometimes necessary to remove the meter. For example, in the case of an electrical fire, the immediate course of action is to use the meter as a disconnect device by pulling it out of its socket.

In areas subject to severe winter weather, there is also a need to be able to replace the meter after removal. For example, if electrical overheating had been taking place and if it had been remedied, it would be necessary to replace the meter in the winter time to prevent freezing inside the metered building.

Thus, there has been a long felt need for a meter which can be removed and reinstalled by a untrained person only in an emergency which will inspire the customer not to become an energy thief because it would cost him money or result in legal action against him.

It has also been long known that the meter should also provide a visual indication if it has been tampered with and is in an alternative operating condition so that the meter reader or customer will be readily aware of the situation.

SUMMARY OF THE INVENTION

The present invention provides a meter having a mechanism associated with one of the bayonets for connecting the normal connection to the meter's measuring components to an alternative connection if the bayonet is removed from the socket terminal into which it as been inserted.

A meter bayonet is biased to the retracted position in the meter and a first contact, connected to the potential coil of the meter, is spring loaded into contact with the bayonet. When the meter is installed in the meter socket, the bayonet slides into a standard terminal clip and the meter measures normally. When the meter is removed for any reason, the normal spring action of the terminal clip frictionally holds the bayonet until it is moved to an extended position where a detent assembly including a spring loaded second contact, connected to different parts of the potential coil in different embodiments, is allowed into contact with the bayonet as an insulated tip on the second contact extend through a hole in the bayonet and pushes the first contact away from the bayonet. If a second installation of the meter is attempted without disassembly and resetting, the meter will merely light an indicator light, stop the meter indicator from running while providing an indicator light, or cause the meter indicator to read fast while providing an indicator light.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 is a side view of an electricity meter incorporating the present invention;

FIG. 2 is a top view of a terminal clip in a meter socket;

FIG. 3 is a top view, partly in section, of a bayonet area of a meter and a schematic illustration of the preferred embodiment of the present invention in a first position;

FIG. 4 is a top view, partly in section, of the bayonet area of a meter and schematic illustration of the preferred embodiment of the present invention in a second position.

DESCRIPTION OF THE PREFERRED EMBODIMENTS

The disclosure of the copending application Ser. No. 208,730, filed Nov. 20, 1980, assigned to the same assignee as the present application is incorporated herein by reference thereto.

Referring to FIG. 1, therein is shown the side view of a meter 10 having a transparent cover 12 secured to a meter base 14. The meter base 14 supports the meter's measuring components 16 which include a several thousand turn potential coil 18 and numerical register 20. The measuring components 16 measure the quantity of electrical power passing among an upper pair of bayonets 22 and lower pair of bayonets 24, and provide signals to the register 20 so it provides an indication proportional to the quantity.

Referring to FIG. 2, therein is shown a terminal 26 which is typical of the four terminals mounted in a meter socket 28 which are slidably engaged by the bayonets when the meter 10 is installed on a building. The terminal 26 includes a fastener 30 which projects through the socket 28 and a spring terminal clip 32 into a mating part such as a nut 34. The terminal clip 32 has a turned in portion 36 and the nut 34 is generally connected to a conductor which is connected either to a source of electrical power (not shown) or, through control switches, to an electrical power utilizing load (not shown).

Referring now to FIG. 3, therein is shown the preferred embodiment of the present invention in a first position with a meter bayonet 38 which is one of the pair of bayonets which will engage the terminal 26 which is connected to the electrical source. The bayonet 38 is slidably carried by the meter base 14 and is biased to a retracted position by a light leaf spring 40 abutting a rollpin 42 provided in the bayonet 38.

A cylindrical main contact 44 biased by a spring 46 engages a side of the bayonet 38 in such a manner that electrical power may be transmitted therebetween. The first contact 44 is conductively connected to a main conductive connection 48 which is connected to one end of the potential coil 18.

On the opposite side of the bayonet 38 axially in line with the main contact 44 is a detent assembly 50. The detent assembly 50 consists of a cylindrical alternative contact 52 having a cylindrical insulated spacer tip 54 which is longer than the thickness of the bayonet and which is urged by a spring 56 into abuttment with the bayonet 38 near an opening or cylindrical hole 58 provided therein slightly larger in diameter than that of the insulated spacer tip 54. The alternative contact 52 is connected to an alternative conductive connection 60 which will be described in greater detail later.

While a stop in the form of a contact or an insulator could be provided to for the top of the bayonet 38 to abut to establish its retracted position, in the preferred embodiment, the rollpin 42 will abut the contacts 44 and 52 to provide the stop. The extended position of the bayonet 38 is established by the location of the hole 58 and the insulated spacer tip 54.

In normal operation, the meter 10 will be inserted into its meter socket 28 with the bayonet 38, in its normal retracted position, being forced into the terminal clip 26. Electrical power flows from the terminal clip 26 through the bayonet 38, the main contact 44, and the main conductive connection 48 into the potential coil 18 and the measuring components 16.

When the meter is removed by a customer-turned thief for tampering or by a utility man for servicing because of a meter failure, the turned in portions 36 of the terminal clip 32 will frictionally hold the bayonet 38 and cause it to slide in the meter base 14 to its entended position, which for purposes of illustration is shown in FIG. 4. In the extended position, the insulated spacer tip 54 of the detent assembly 50 will first be urged by the spring 56 into the hole 58 to prevent retraction of the bayonet 38 into the meter 14. As the detent assembly 50 is fully and irrevocably engaged, the spring 56 which is stronger than the spring 46 will cause the insulated spacer tip 54 to push the main contact 44 out of engagement with the bayonet 38 and then cause the alternative contact 52 to engage the bayonet 38.

If the meter 10 is reinserted in a meter socket 28 without being disassembled and reset, the electrical power will pass from the terminal clip 26 into the bayonet 38, through the alternative contact 52 and into the alternative conductive connection 60.

The alternative conductive connection 60 contains a visual indicator 62 which represents different elements, as would be evident to those skilled in the art, depending upon whether the alternative conductive connection 60 is connected to the potential coil 18 as shown by 60A and 60B in FIG. 3 or as shown by 60C in FIG. 4, respectively away from the ends, bypassing the potential coil 18, or just bypassing the main conductive connection 48.

For the connection shown by 60A, where the meter register 20 will run fast, back-to-back light emitting diodes, an incandescent lamp, or a liquid crystal display may be used for the visual indicator 62. For the connection shown by 60B where the meter register 20 will be stopped, a standard light emitting diode or a neon lamp may additionally be used. For the connection shown by 60C, only the back to back light emitting diodes will work.

A printed notice on the meter will inform the customer or meter reader that the meter has been tampered with when the indicator light 64 is lit and that the utility company should be contacted as soon as possible for replacement because the meter is running fast.

While special tools could be made to allow resetting of the detent 50 in the field, it is believed that it would be more desirable to merely replace the meter in the field and reset the meter at the utility company's shop after a comprehensive disassembly. This would prevent possible energy theft by unauthorized use of special tools to field reset meters which have been tampered with. It is in the sense that fiels resetting would be quite difficult that the term "irrevocably" is used.

As many possible embodiments may be made of the invention without departing from the scope thereof, it is to be understood that all matter herein set forth or shown in the accompanying drawings is to be interpreted in an illustrative and not a limiting sense.

I claim:

1. An electricity meter engageable with terminals in a meter socket to allow operative connection between a source of electrical power and an electrical power utilizing load, comprising:

measuring means for measuring the amount of electrical power passing therethrough and normally providing an indication proportional thereto;

a bayonet having first and second sides and an opening provided therein intersecting said first and second sides, said bayonet being conductively engageable with one of said terminals connected to said source, said bayonet being biased to a retracted position in said meter and frictionally holdable by said one of said terminals upon disengagement of said meter from said meter socket until said bayonet moves to an entended position;

main contact means including biasing means urging said main contact means into engagement with said first side of said bayonet when said bayonet is in its retracted position, said main contact means being connected to said measuring means to provide a conductive connection for the passage of electrical power between said bayonet and said measuring means; and detent means operatively associated with said bayonet to allow the movement of said bayonet from said retracted to said extended position, said detent means including an insulated spacer portion sized to protrude through said opening in said bayonet and biasing means urging said spacer portion into engagement with said second side when said bayonet is in its retracted position, said biasing means of said detent means being stronger than said biasing means of said main contact means to cause said spacer portion to extend through said opening in said bayonet when said bayonet is in its extended position and to urge said main contact means out of engagement with said first side of said bayonet, whereby said detent means acts to lock said bayonet in said extended position, and whereby the conduction of electrical power between said bayonet and said measuring means is altered when said bayonet is moved to said extended position.

2. The invention as claimed in claim 1 including alternative connecting means having a conduction indicator provided therein connected to said measuring means, and wherein said detent means includes alternative contact means operatively connected to said alternative connecting means, said detent means being responsive to the movement of said bayonet to said extended position to urge said alternative contact means into conductive engagement with said bayonet whereby said conduction indicator provides an indication when said meter reengages said meter socket.

3. The invention as claimed in claim 1 wherein said detent means includes alternative contact means operatively connected to said measuring means, said alternative contact means sized larger than said opening and disposed between said biasing means of said detent means and said spacer portion, said detent means responsive to the movement of said bayonet to the second position to urge said alternative contact means into conductive engagement with said bayonet whereby said main contact means disengages from said bayonet as said alternative contact means engages said bayonet to alter the passage of electrical power through said measuring means when said bayonet reengages said meter socket.

4. The invention as claimed in claim 3 wherein said measuring means includes a potential coil having a predetermined number of turns conductively connected at one end to said main contact means and said alternative contact means is connected to said potential coil a predetermined number of turns from said one end whereby said measuring means indication is fast when said meter reengages said meter socket.

5. The invention as claimed in claim 4 or 3 wherein said alternative connecting means includes indicator means conductively connected to said detent means for providing an indication when said engagement means is reengaged with said meter socket.

6. An electricity meter engageable with terminals in a meter socket connected a source of electrical power and an electrical power utilizing load to allow operative connection therebetween, comprising:

measuring means for measuring the amount of electrical power passing therethrough and normally providing an indication proportional thereto;

a bayonet conductively engageable at one end with one of said terminals connected to said source, said bayonet biased to a retracted position in said meter and frictionally holdable by a said one of said terminals upon disengagement of said meter from said meter socket until said bayonet moves to an extended position, said bayonet having a through opening provided therein in an end distal from said terminal engaging end;

a main conductive connection connected to said measuring means;

cylindrical main contact means sized to not fit through said opening in said bayonet and connected to said main conductive connection;

main biasing means urging said main contact into engagement with said bayonet proximate said opening provided therein;

an alternate conductive connection connected to said measuring means and having a visual indicator provided therein for indicating the conduction of electrical power therethrough when said bayonet is in said extended position;

a cylindrical alternative contact coaxial with said main contact sized not to fit through said opening in said bayonet, and connected to said alternative conductive connection;

a cylindrical insulated spacer tip disposed between said bayonet and said alternative contact means, coaxial with said alternative contact; and sized to fit through said opening in said bayonet and extend therethrough;

alternative biasing means urging said alternative contact and said insulated spacer tip towards said main contact and into abutment with said bayonet proximate said opening provided therein, said alternative biasing means being stronger than said main biasing means so that said insulated spacer tip will urge the main contact out of engagement with said bayonet when said insulated spacer tip extends through said opening and said alternative contact will be brought into engagement with said bayonet when said insulated spacer tip extends through said opening whereby to lock said bayonet in said extended position.

* * * * *

UNITED STATES PATENT AND TRADEMARK OFFICE
CERTIFICATE OF CORRECTION

PATENT NO. : 4,386,313

DATED : May 31, 1983

INVENTOR(S) : Norman B. Venaas et al

It is certified that error appears in the above-identified patent and that said Letters Patent are hereby corrected as shown below:

Column 1, line 57, "as" should read -- has --.

Column 2, line 2, "extend" should read -- extends --.

Column 3, line 10, "abuttment" should read -- abutment --.

Column 3, line 17, delete "to" (first occurrence).

Column 4, line 3, "64" should read -- 62 --.

Column 4, line 13, "fiels" should read -- field --.

In the Claims:

Claim 6, column 5, line 35, insert -- to -- between "connected" and "a".

Signed and Sealed this

Twenty-third Day of August 1983

[SEAL]

Attest:

GERALD J. MOSSINGHOFF

Attesting Officer

Commissioner of Patents and Trademarks